(12) United States Patent
Yumoto

(10) Patent No.: US 6,588,099 B2
(45) Date of Patent: Jul. 8, 2003

(54) PROCESS FOR MANUFACTURING MOLDED CIRCUIT BOARD

(75) Inventor: Tetsuo Yumoto, Tokorozawa (JP)

(73) Assignee: Sankyo Kasei Kabushiki Kaisha, Tokyo (JP)

( * ) Notice: Subject to any disclaimer, the term of this patent is extended or adjusted under 35 U.S.C. 154(b) by 87 days.

(21) Appl. No.: 09/767,115

(22) Filed: Jan. 22, 2001

(65) Prior Publication Data

US 2002/0138978 A1 Oct. 3, 2002

(51) Int. Cl.[7] ................................................. H01K 3/22
(52) U.S. Cl. ............................ 29/848; 29/846; 29/851; 462/272.17
(58) Field of Search .......................... 29/848, 846, 851; 264/272.15, 272.17, 162, 233, 344

(56) References Cited

U.S. PATENT DOCUMENTS

| | | | | |
|---|---|---|---|---|
| 4,758,459 A | * | 7/1988 | Mehta | 174/255 |
| 4,867,839 A | * | 9/1989 | Sato et al. | 205/164 |
| 4,997,674 A | * | 3/1991 | Parr et al. | 427/123 |
| 5,292,469 A | * | 3/1994 | Bowman et al. | 264/169 |
| 5,292,470 A | * | 3/1994 | Reddy et al. | 264/169 |
| 5,326,509 A | * | 7/1994 | Chuah et al. | 264/101 |
| 5,334,279 A | * | 8/1994 | Gregoire | 156/150 |
| 5,617,629 A | * | 4/1997 | Ekstrom | 156/150 |
| 5,681,356 A | * | 10/1997 | Barak et al. | 264/272.17 |
| 5,937,493 A | * | 8/1999 | Nellissen | 29/25.35 |

FOREIGN PATENT DOCUMENTS

JP 145583 5/1999

* cited by examiner

Primary Examiner—Joseph J. Hail, III
Assistant Examiner—Alvin J. Grant
(74) Attorney, Agent, or Firm—Jordan and Hamburg LLP

(57) ABSTRACT

A molded circuit board is formed by a process comprising the steps of: molding liquid crystal polymer of plating grade into a primary molded member which outline corresponds to the dimensions of the molded circuit board; roughening the surface of the primary molded member; molding a secondary molded member by coating the primary molded member with oxyalkylene-containing poly(vinyl alcohol) resin over the surface thereof except for a portion thereof on which a circuit is to be formed; heating the first and secondary molded members; applying catalyst to the portion of the surface of the primary molded member not covered by the secondary molded member; heating the first and secondary molded members in hot water to elute the secondary molded member; and chemically plating the catalyst-applied-portion to form the circuit thereon, by which the size of the molded circuit board is minimized with simple procedures and production cost reduced.

8 Claims, 4 Drawing Sheets

PROCESS FOR MANUFACTURING MOLDED CIRCUIT BOARD

BACKGROUND OF THE INVENTION

The present invention relates to a process for manufacturing a molded circuit board for an internal antenna or the like by plating portions of the surface of a molded member or the inner surface of an aperture provided in the molded member.

The present inventors previously suggested a process for manufacturing a partially-plated plastic molded product. For manufacturing a circuit substrate, for example, the method comprises the steps of: molding a circuit substrate as a primary molded member in dies; roughening the surface of the substrate, applying catalyst to the substrate for pretreatment, placing the pre-treated substrate in dies; coating the substrate with plastic material except for a portion of the substrate on which a circuit is to be formed such that the circuit substrate is covered with the plastic but with only the circuit portion remaining uncovered, by which a circuit substrate as a secondary molded member is produced; and plating the substrate to produce a final product of the circuit substrate with only the circuit portion plated.

In such processes, however, the material that is molded in the second molding step (i.e., secondary molded member) will remain in the final product. Accordingly, if a mixture of fillers such as glass fiber is used as a plastic material for the second molding step, the production cost will rise. Alternatively, if resin is used as a second molding material, as the resin needs high-pressure injection, the circuit portion of the substrate is required to be thicker and wider, causing the whole body of the substrate to be larger, and therefore there is a limit to making the circuit substrate, as the final product, thin and compact.

Accordingly, an object of the present invention is to provide a method for manufacturing a molded circuit board with its size as small as possible by eluting the secondary molded member in an intermediate step of its manufacturing process. Another object is to avoid the environmental pollution in the elution step by using biodegradable resin as the material for the secondary molded member. A further object is to reduce production cost by using material that can be eluted easily and simplifying the procedure.

SUMMARY OF THE INVENTION

For the above-described objects, the process for manufacturing a molded circuit board according to the present invention comprises the following steps. A first step is molding a primary molded member by injecting liquid crystal polymer of plating grade in a cavity that has an outline corresponding to the dimensions of the molded circuit board. A second step is roughening the surface of the primary molded member. A third step is molding a secondary molded member by inserting the primary molded member into a cavity formed in such a shape that when said primary molded member is inserted thereinto, a gap is provided around the surface of the primary molded member except for a portion thereof on which a circuit is to be formed and then injecting the oxylkylene-containing poly (vinyl alcohol) resin into the cavity. A fourth step is heating the first and secondary molded members as a whole in a stream of hot air to improve the water resistance thereof. A fifth step is applying a catalyst such as palladium and/or gold on the portion of the surface of the primary molded member on which the circuit is to be formed. A sixth step is heating the first and secondary molded members as a whole in hot water to elute the secondary molded member into the hot water. And a seventh step is plating the catalyst-applied portion of the primary molded member to form the circuit.

Liquid crystal polymer of plating grade may be used as a material for the primary molded member due to the following favorable properties. First, as liquid crystal polymer of plating grade has solder-heat-resistance, it can provide greater resistance against solder reflow when a circuit is formed on the surface of the primary molded member. Second, as the polymer exhibits a unique structure called a "skin layer" on its surface, it can provide greater releasability of the primary molded member from the secondary molded member.

Further, oxyalkylene-containing poly(vinyl alcohol) may preferably be used for the material of the secondary molded member due to the following properties. First, as oxyalkylene-containing poly can be easily melted and molded, it is suitable for injection molding. Second, as it is water-soluble, it can be eluted easily. Third, as it is biodegradable, it can be reduced to naturally existing materials without polluting the surrounding environment.

DETAILED DESCRIPTION OF THE PREFERRED EMBODIMENTS

Figure 1A:
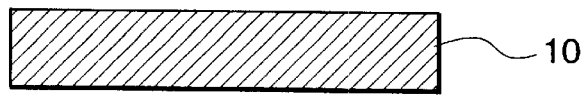
FIGS. 1A to 1G are cross sectional views of intermediate products formed by the respective steps of the process according to the present invention.
Figure 1B:
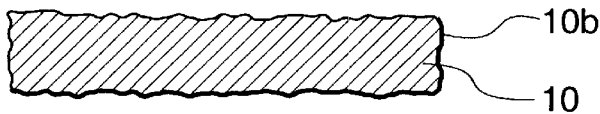
Figure 1C:
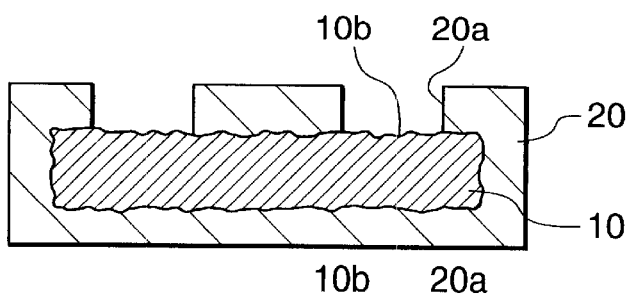
Figure 1D:
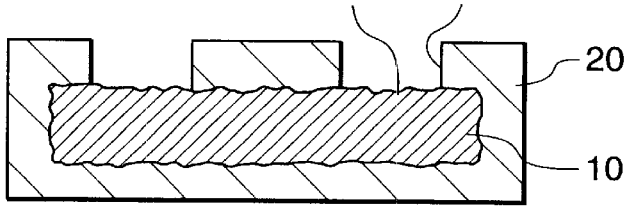
Figure 1E:
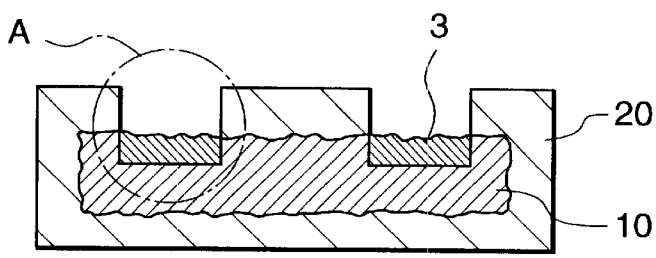
Figure 1F:
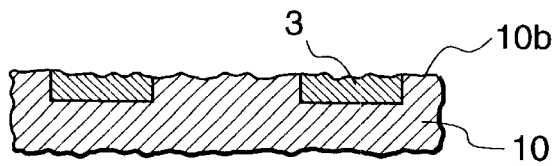
Figure 1G:
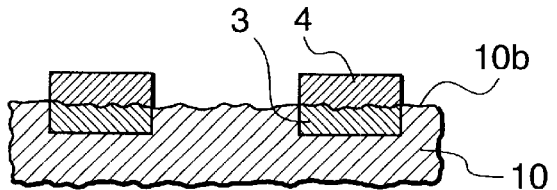
Figure 2:
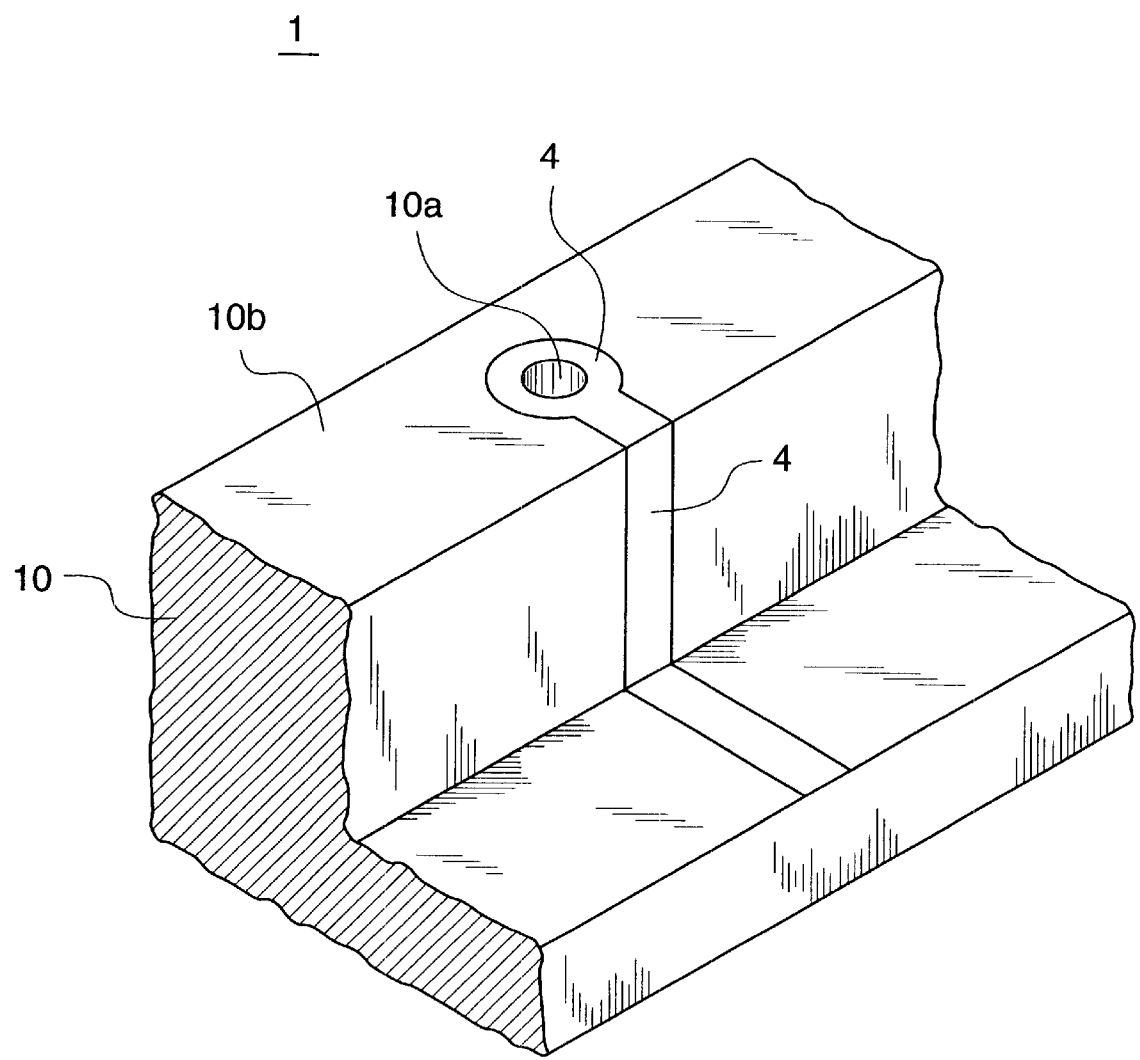
FIG. 2 is a perspective top view of a molded circuit board manufactured by the process according to the present invention.
Figure 3:
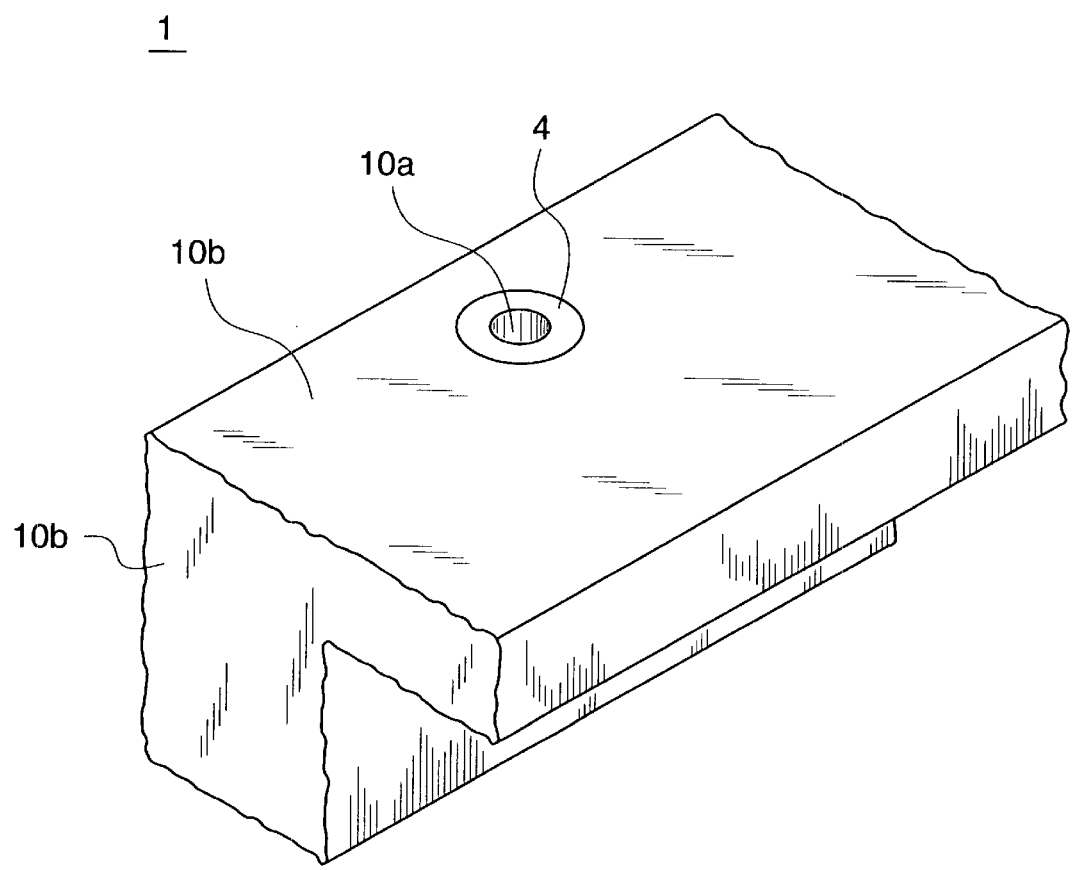
FIG. 3 is a perspective bottom view of a molded circuit board manufactured by the process according to the present invention.

As one example of the embodiment according to the present invention, a process for manufacturing a molded circuit board 1 as shown in FIGS. 2 and 3 will be described in detail in reference to the steps shown in FIGS. 1A to 1G.

FIG. 1A shows a primary molded member 10 produced by the first molding step. The primary molded member 10 has an outline feature that corresponds to the dimension of the final product, i.e., molded circuit board 1. Conventional upper and lower dies (not shown) may be used for the first molding step. When engaged with each other, these dies form a cavity defined by their opposing inner surfaces that corresponds to the step-like outline as shown in FIGS. 2 and 3. In the cavity is provided a pin for forming an aperture 10a through the thicker portion of the molded circuit board 1. While the upper and lower dies are engaged with each other to form a cavity therebetween, liquid crystal polymer of plating grade (polyester resin) as the material of the primary molded member is injected and molded in the cavity.

The liquid crystal polymer may be any aromatic polyester liquid crystal polymer such as "Vectra" (available from Polyplastics Co., Ltd.) with plating grade C810.

An exemplary condition for the injection molding in the first molding step is given as follows:

| | |
|---|---|
| Injection material | "Vectra" plating grade C810 |
| Cylinder temperature | 320° C. |
| Die temperature | 110° C. |
| Injection pressure | 1,200 Kg/cm² |
| Cooling time | 20 sec. |

FIG. 1B shows a second step, in which the primary molded member 10 is degreased and its surface is roughened (etched). Accordingly, the entire surface of the primary molded member 10 including its outer surface and the inner surface of the aperture 10a provided therein is made rough (course surfaces 10b). One example of etching involves heating an alkaline solution containing caustic soda or caustic alkali of a predetermined amount (e.g., 45 wt %) dissolved in water to a predetermined temperature such as 50 to 90° C., and soaking the primary molded member 10 in the solution for a predetermined period of time such as 30 minutes. The etching roughens its outer surface entirely (rough surface 10b).

FIG. 1C shows a secondary molded member 20 molded in the second molding step by using conventional upper and lower dies (not shown). Each of the upper and lower dies are formed with a cavity having such a shape that a predetermined gap may be provided around the surface of the primary molded member 10 when it is inserted thereinto and those dies are engaged. On the other hand, portions of the cavities, which either corresponds to a portion of the surface of the primary molded member 10 on which a circuit 4 is to be formed or covers the aperture 10a, are provided with protrusions and/or pins. Thereby, when the primary molded member 10 is inserted into the cavity and the dies are engaged, no gap is left around the portion of the surface of the primary molded member 10 on which the circuit 4 is to be formed. With these dies combined together to form the cavity therebetween, an oxyalkylene-containing poly(vinyl alcohol) resin as the material for the secondary molded member 20 is then injected, to be molded in the cavity. After release from the dies, the first and secondary molded members 10, 20 as a whole have a groove 20a on which the circuit is to be formed. Further, a rough surface 10b of the primary molded member 10 is exposed either at the bottom surface of the groove 20a or at the inner surface of the aperture 10a that communicates with the groove 20a. In other words, the primary molded member 10 is now coated with the secondary molded member 20 except for the portion thereof on which the circuit 4 (see FIGS. 1G, 2, and 3) is to be formed.

As the oxyalkylene-containing poly(vinyl alcohol) resin, "ECOMATY AX" (available from The Nippon Synthetic Chemical Industry Co., Ltd.), for example, is used.

One exemplary conditions for the injection molding to be used in the second molding step is given as follows:

| | |
|---|---|
| Injection material | "ECOMATY AX" |
| Cylinder temperature | 220° C. |
| Die temperature | 80° C. |
| Injection pressure | 900 Kg/cm² |
| Cooling time | 30 sec. |

The first and secondary molded members 10, 20 as a hole are then subjected to heat treatment (annealing) at the fourth step as shown in FIG. 1D. The heat treatment will improve the water resistance of the secondary molded members 20 by using a stream of hot air, particularly atmospheric hot air. Conditions used for the heating step depend on the thickness of the secondary molded members 20. If it is 0.4 mm in thickness, for example, hot air of 175° C. may be blown into it for 45 minutes. Hot air of 195° C. will increase the number of double bonds and carbonyl groups present in the poly (vinyl alcohol) to produce hot-water-insolubles.

The heat treatment also provides improved crystallinity and water-resistance. Generally, hot air of 130 to 195° C. may be used. Further, it has been proved that air oxygen may cause distinct auto-oxidization and that the material which is insoluble during the early stage of the heat treatment will be converted to soluble by hydrochloric acid treatment.

Figure 4A:
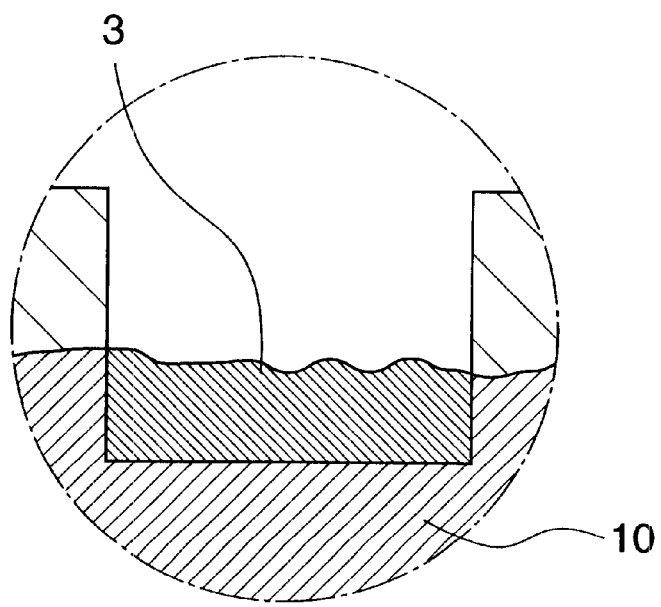
FIG. 4 is an enlarged cross sectional view of the region A defined by the phantom line in FIG. 1E, showing a probable swelling of a secondary member produced by a process similar to the present invention but without heating (annealing) treatment of step 4.
Figure 4B:
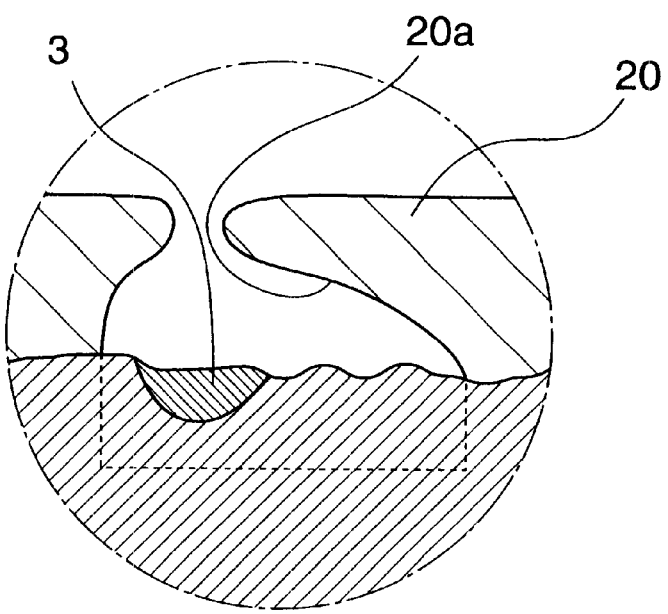

The heating step enables formation of the inner surface of the groove 20a in the secondary molded member 20 as shown in FIGS. 1E and 4A by forming the inner surface vertical to the primary molded member 10 as shown in FIG. 1C, and adding catalyst 3 precisely within a predetermined range, thereby forming the circuit 4 within the predetermined portion as shown in FIG. 1E. Without the heating step, however, the secondary molded member 20 may expand to cover the groove 20a as shown in FIG. 4B. This may prevent the catalyst 3 from being applied precisely to a proper area in the next step. FIG. 4 is an enlarged view of area A defined in FIG. 1E. Phantom line surrounding the catalyst 3 in FIG. 4 shows the predetermined range within which the catalyst should desirably be applied.

FIG. 1E shows the fifth step of applying a catalyst 3 such as palladium and/or gold to the rough surface 10b of the primary molded member 10 exposed at the bottom surface of the groove 20a of the secondary molded member 20. The catalyst 3 may be applied by any known method. For example, the fist and secondary molded members 10, 20 as a whole may be soaked in a catalyst mixture solution of, for example, tin and palladium, and then activated by acid such as hydrochloric acid or sulfuric acid to deposit palladium on the exposed surface 10b. Alternatively, relatively strong reducer such as stannous chloride may be adsorbed on the surface of the first and secondary molded members 10, 20 as a whole, which are then soaked in catalyst solution containing noble metal ions such as gold to deposit the gold on the exposed surface 10b. The soaking is conducted in the solution at 15 to 23° C. for 5 minutes.

FIG. 1F shows the sixth step of heating the catalyst-applied first and secondary molded members 10, 20 as a whole in hot water to elute the secondary molded member 20 in the hot water. By soaking the first and secondary molded members 10, 20 as a whole in hot water at 80° C. for 60 minutes, the "ECOMATY AX," the material of the secondary molded member, is eluted in the hot water. On the other hand, "Vectra" plating grade C810, the material of the primary molded member 10, remains unchanged as the "Vectra" has a heat deformation temperature of 200° C. or more. Then, the first molded member 10 may be washed with water. Thereby, the primary molded member 10 is obtained with catalyst 3 applied on the predetermined portion of the rough surface thereof (shown in FIG. 1B) on which the circuit 4 is to be formed.

FIG. 1G shows the seventh step of the process for plating the catalyst-applied-portion of the primary molded member 10 to form the circuit 4. Chemical copper plating, chemical nickel plating or the like may be used. Accordingly, plating is conducted on the catalyst 3 that is applied either to the portion of the rough surface 10b of the primary molded member 10 on which the circuit 4 is to be formed or to the rough inner surface of the aperture 10a. Thereby, the circuit 4 is formed thereon as shown in FIGS. 2 and 3. Finally, moisture is removed from the primary molded member 10 with the circuit formed thereon by heating, by which the formation of a conductive circuit is completed, and the molded circuit board 1 is obtained.

The present invention provides the following advantages. First, it can provide an improved heat resistance as well as an improved releasability of the primary molded member 10 from the secondary molded member 20 since the liquid crystal polymer of plating grade used in the primary molded member 10 has high heat-resistance and can provide a skin layer. Second, it is convenient to use oxyalkylene-containing poly(vinyl alcohol) resin as the material for the secondary molded member 20 since the resin has the following properties: it can be easily melted and molded, thus suitable for injection molding; it is water-soluble and thus can be eluted easily; and it is biodegradable and can be reduced to naturally existing materials without polluting environment. Third, it is possible to minimize the size of the circuit board since the secondary molded member 20 can be eluted and thus will not remain on the final product. Forth, the circuit 4 can be formed precisely within a predetermined portion since the heat treatment after the second molding step will enable precise application of the catalyst 3 within a proper portion. Fifth, simple procedure and reduced production cost can be attained since catalyst can be applied only to the portion not covered by the secondary molded member 20 (i.e. the uncovered surface on which the circuit 14 is to be formed), which minimizes the amount of the material required.

What is claimed is:

1. A process for manufacturing a molded circuit board, comprising the steps of:

molding a primary molded member that has an outline corresponding to the dimensions of said molded circuit board;

roughening a surface of said primary molded member;

molding a secondary molded member by applying a coat of synthetic resin that has a melting point lower than the heat degradation temperature of said primary molded member on the surface of said primary molded member except for a portion thereof on which a circuit is to be formed;

heating said primary and secondary molded members as a whole to improve the water resistance thereof;

applying a catalyst to said portion of the surface of said primary molded member;

heating said primary and secondary molded members as a whole in hot water to elute said secondary molded member into hot water; and plating said portion of the surface of said primary molded member to form said circuit.

2. The process according to claim 1 wherein said step of molding a primary molded member involves injecting a synthetic resin of plating grade into a cavity that corresponds to the dimensions of said molded circuit board.

3. The process according to claim 1 wherein said eluting step involves heating said first and secondary molded members as a whole in hot water to elute said secondary molded member into hot water.

4. The process according to claim 2 wherein said synthetic resin of plating grade used for molding said primary molded member is polyester resin.

5. The process according to claim 4 wherein said polyester resin is an aromatic polyester liquid crystal polymer.

6. The process according to claim 1 wherein said step of molding a secondary molded member involves inserting said primary molded member having the roughened surface into a cavity formed in such a shape that when said primary molded member is inserted thereinto, a gap is provided around the surface of said primary molded member except for a portion thereof on which a circuit is to be formed, and injecting a synthetic resin having a lower melting point than the heat degradation temperature of said primary molded member into said cavity, to apply a coat of said synthetic resin on said primary molded member.

7. The process according to claim 1 wherein said heating step involves heating said primary and secondary molded members as a whole in hot atmospheric air.

8. The process according to claim 1 wherein said synthetic resin that has a melting point lower than the heat degradation temperature of said primary molded member for molding said secondary molded member is oxyalkylene-containing poly(vinyl alcohol) resin.

* * * * *